United States Patent
Lo et al.

(10) Patent No.: US 10,515,845 B2
(45) Date of Patent: Dec. 24, 2019

(54) SEMICONDUCTOR STRUCTURE INCLUDING ISOLATIONS AND METHOD FOR MANUFACTURING THE SAME

(71) Applicant: TAIWAN SEMICONDUCTOR MANUFACTURING COMPANY LTD., Hsinchu (TW)

(72) Inventors: Wen-Shun Lo, Hsinchu County (TW); Yu-Chi Chang, Kaohsiung (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/902,422

(22) Filed: Feb. 22, 2018

(65) Prior Publication Data

US 2019/0139816 A1 May 9, 2019

Related U.S. Application Data

(60) Provisional application No. 62/583,914, filed on Nov. 9, 2017.

(51) Int. Cl.
*H01L 21/762* (2006.01)
*H01L 29/06* (2006.01)
(Continued)

(52) U.S. Cl.
CPC ...... *H01L 21/76237* (2013.01); *H01L 21/266* (2013.01); *H01L 21/26513* (2013.01);
(Continued)

(58) Field of Classification Search
CPC ................................................ H01L 21/76237
See application file for complete search history.

(56) References Cited

U.S. PATENT DOCUMENTS 6,461,936 B1  10/2002  von Ehrenwall
6,590,271 B2  7/2003  Liu et al.
(Continued)

FOREIGN PATENT DOCUMENTS

TW  I223385  9/1992

OTHER PUBLICATIONS

Office Action and Search Report dated Apr. 23, 2019 by Taiwan Intellectual Property Office for counterpart application No. 107119669.

*Primary Examiner* — Mark V Prenty
(74) *Attorney, Agent, or Firm* — WPAT, P.C., Intellectual Property Attorneys; Anthony King

(57) ABSTRACT

A method for manufacturing a semiconductor structure including isolations includes receiving a substrate including a first region and a second region; forming a patterned hard mask, the patterned hard mask including a first opening exposing a portion of the first region and a second opening exposing a portion of the second region; removing portions of the substrate to form a first trench in the first region and to form a second trench in the second region; performing an ion implantation to a portion of the patterned hard mask in the first region and a portion of the substrate exposed from the first trench; enlarging the first opening to form a third opening over the first trench and enlarging the second opening to form a fourth opening over the second trench; and forming a first isolation by filling the first trench and a second isolation by filling the second trench.

20 Claims, 19 Drawing Sheets

(51) Int. Cl.
*H01L 21/265* (2006.01)
*H01L 21/324* (2006.01)
*H01L 21/8234* (2006.01)
*H01L 21/266* (2006.01)
*H01L 29/423* (2006.01)
*H01L 27/11* (2006.01)
*H01L 29/165* (2006.01)

(52) U.S. Cl.
CPC .... *H01L 21/324* (2013.01); *H01L 21/823481* (2013.01); *H01L 29/0649* (2013.01); *H01L 29/42368* (2013.01); *H01L 27/1104* (2013.01); *H01L 27/1116* (2013.01); *H01L 29/165* (2013.01)

(56) References Cited

U.S. PATENT DOCUMENTS

| | | | |
|---|---|---|---|
| 6,818,526 B2 | 11/2004 | Mehrad et al. | |
| 7,208,812 B2 | 4/2007 | Ohta | |
| 7,781,303 B2 * | 8/2010 | Zhao | H01L 21/76237 257/E21.556 |
| 8,299,538 B2 * | 10/2012 | Anderson | H01L 29/66795 257/288 |
| 2005/0035426 A1 | 2/2005 | Ko et al. | |
| 2009/0020845 A1 | 1/2009 | Shin et al. | |

\* cited by examiner

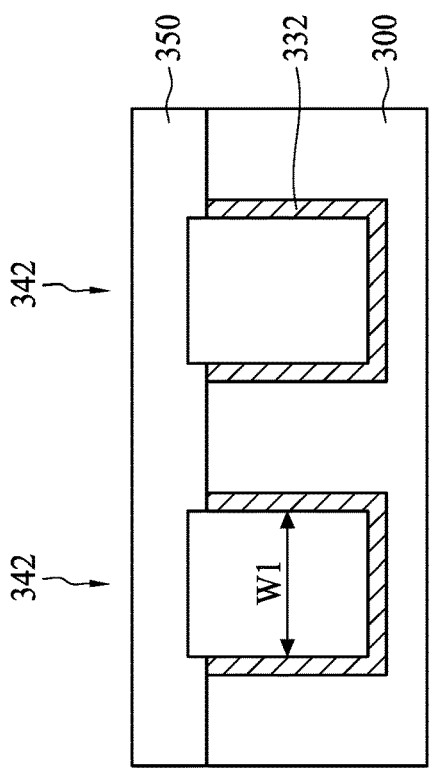
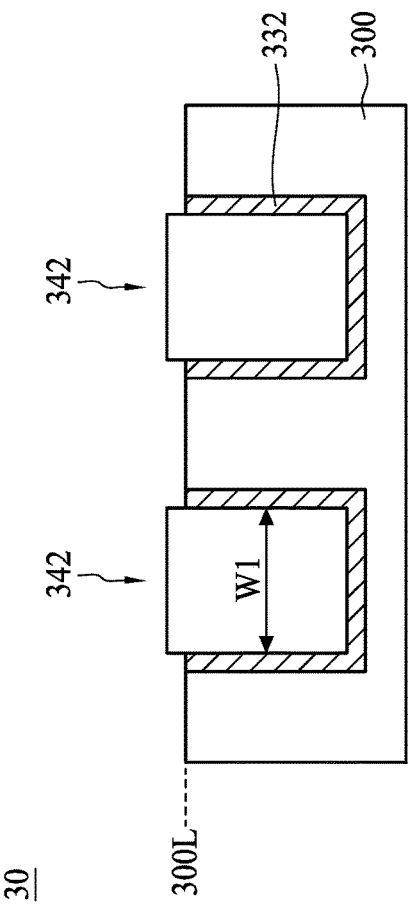
FIG. 3J
FIG. 3I

SEMICONDUCTOR STRUCTURE INCLUDING ISOLATIONS AND METHOD FOR MANUFACTURING THE SAME

PRIORITY DATA

This patent claims the benefit of U.S. Provisional Patent Application Ser. No. 62/583,914 filed Nov. 9, 2017, the entire disclosure of which is hereby incorporated by reference.

BACKGROUND

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern semiconductor technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily or permanently, noise margin degradation, voltage shift, and cross-talk.

Shallow trench isolation (STI) is one of the preferred electrical isolation techniques especially for a semiconductor chip with high integration. Broadly speaking, STI techniques involve the formation of shallow trenches in the isolation areas or regions of a semiconductor wafer. The shallow trenches are then filled with dielectric material such as silicon dioxide to provide electrical isolation between devices subsequently formed in the active regions on either side of the filled trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J are schematic drawings illustrating a semiconductor structure including isolations at various fabrication stages constructed according to aspects of the present disclosure in one or more embodiments.

DETAILED DESCRIPTION

Figure 1:
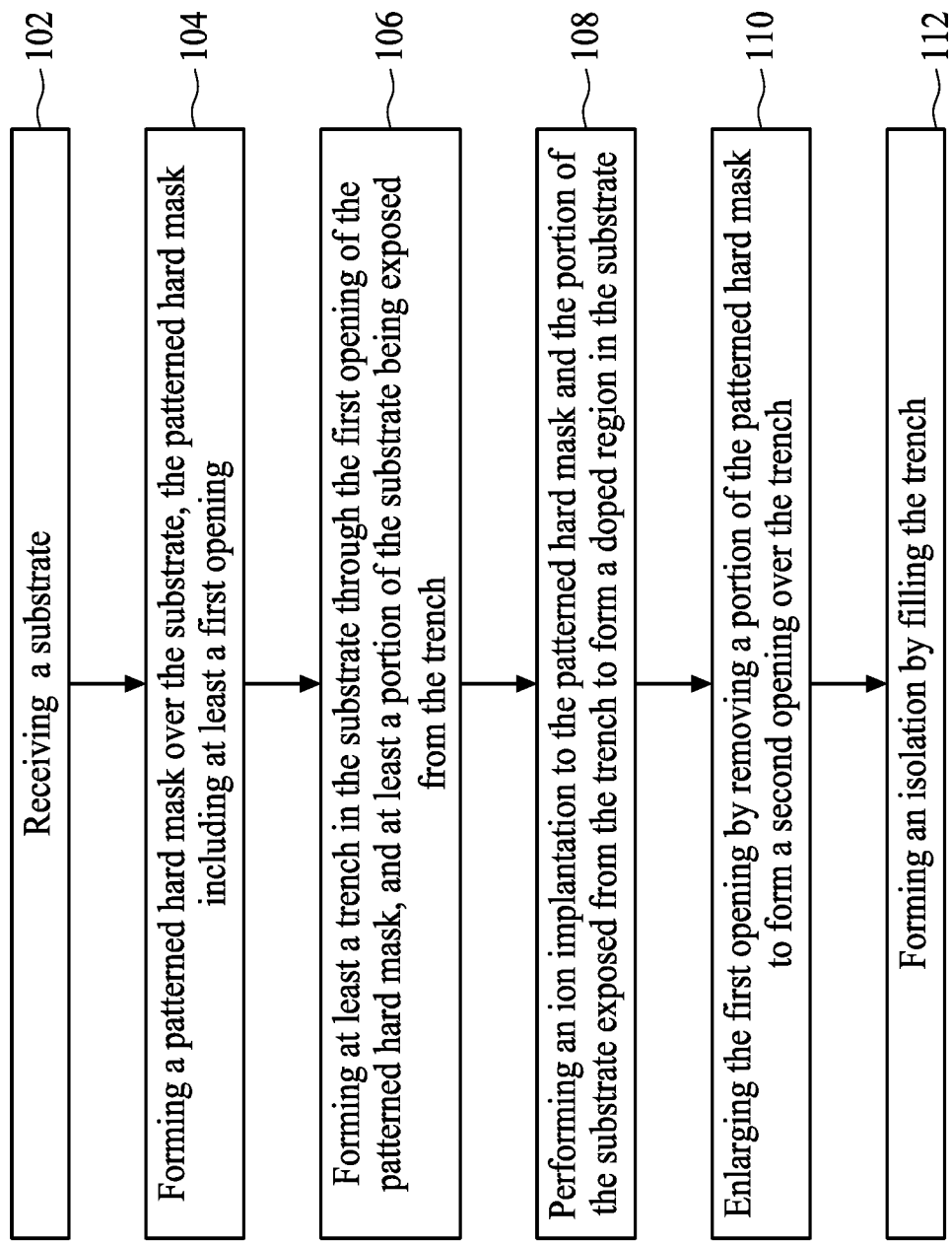
FIG. 1 is a flow chart representing a method for manufacturing a semiconductor structure including an isolation according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

While CMOS scaling has enabled the circuit and system designer to pack a tremendous amount of functionality onto a silicon die, it has simultaneously created a number of significant problems as far as the chip's ability to interface with the outside world. This is particularly true in the area of analog/digital mixed-signal chips. For example, devices in the analog region include a size greater than devices in the logic core region. Similarly, isolations which provide electrical isolations between the devices in the analog region include a size greater than isolations in the logic core region. Further, STI typically includes a step, or a divot at the intersection between the semiconductor substrate and the STI filler material. At the location where the polysilicon film (which forms the gates of transistor devices) extends over the step, electrical field is concentrated. The concentrated electrical field lowers the threshold voltage, Vt, at the corner of the transistor devices. Consequently, the divot issue may cause unwanted noise in the analog circuit. However, the isolations of different sizes are formed at the same time. To deal with the divot issue in the analog region may render adverse impact to STIs in another region (such as the logic core region) due to the susceptibility of isolation structure to process damage during operations. In other words, it is difficult to modify or adjust operations for forming the isolations in the analog region without affecting other isolations in another region, such as the logic core region.

The present disclosure therefore provides a method for manufacturing a semiconductor structure including isolations that is able to mitigate the divot issue. In some embodiments, the present disclosure provides a method for manufacturing a semiconductor structure including isolations that is able to mitigate the divot issue in one region while other isolations in another region are impervious to such operations. Accordingly, isolations of different sizes are both improved and complied with respective design requirements.

FIG. 1 is a flow chart representing a method for manufacturing a semiconductor structure including an isolation 10 according to aspects of the present disclosure. The method for manufacturing the semiconductor structure including the isolation 10 includes an operation 102, receiving a substrate. The method 10 further includes an operation 104, forming a patterned hard mask over the substrate, the patterned hard mask including at least a first opening. The method 10 further includes an operation 106, forming at least a trench in the substrate through the first opening of the patterned hard mask, and at least a portion of the substrate being exposed from the trench. The method 10 further includes an operation 108, performing an ion implantation to the patterned hard mask and the substrate exposed from the trench to form a doped region in the substrate. The method 10 further includes an operation 110, enlarging the first opening by removing a portion of the patterned hard mask to form a second opening over the trench. The method 10 further includes an operation 112, forming an isolation by filling the trench. The method 10 will be further described according to one or more embodiments. It should be noted that the operations of the method 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
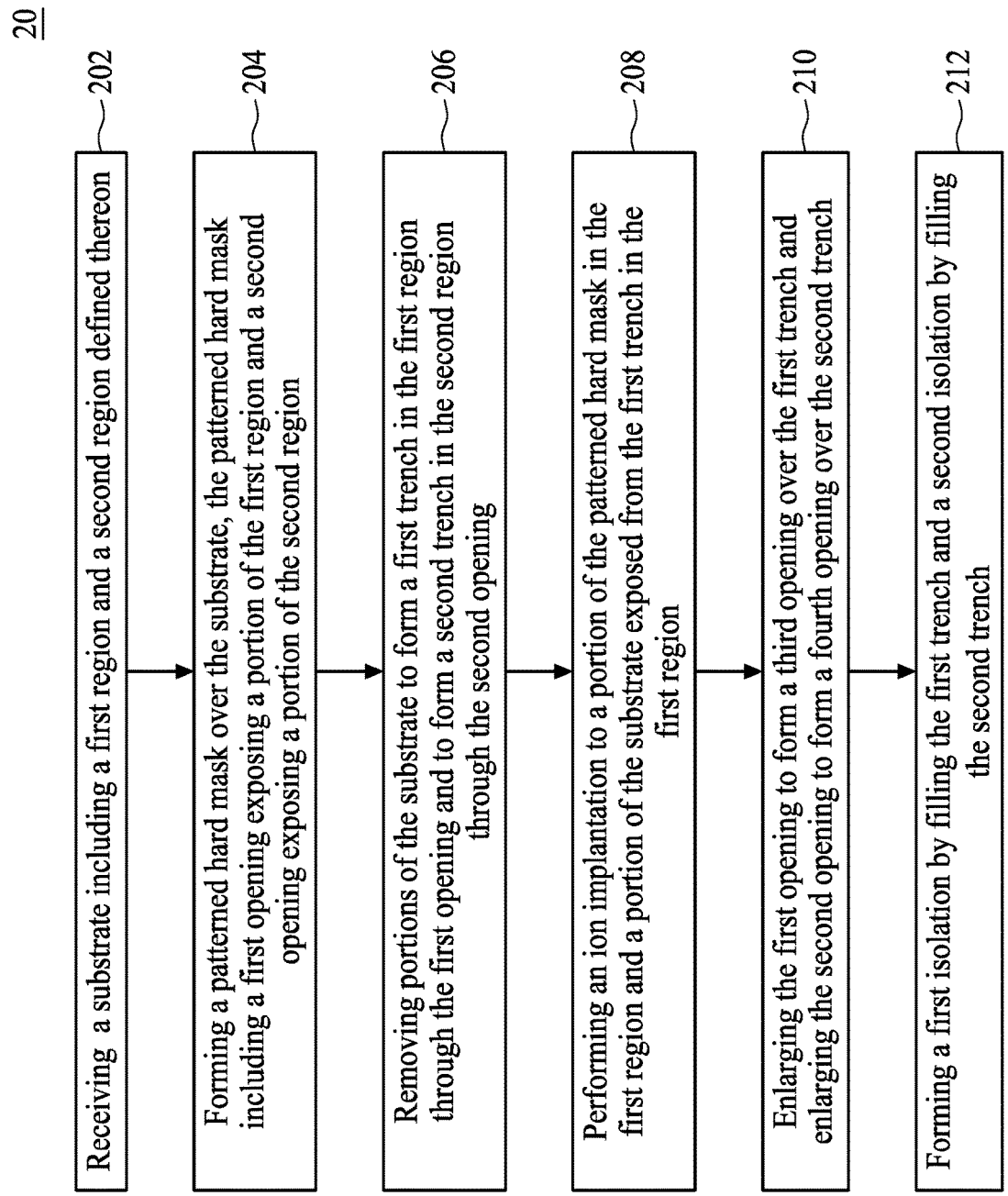
FIG. 2 is a flow chart representing a method for manufacturing a semiconductor structure including isolations according to aspects of the present disclosure.

FIG. 2 is a flow chart representing a method for manufacturing a semiconductor structure including isolations 20 according to aspects of the present disclosure. The method for manufacturing the semiconductor structure including the isolations 20 includes an operation 202, receiving a substrate including a first region and a second region defined thereon. The method 20 further includes an operation 204, forming a patterned hard mask over the substrate, the patterned hard mask including a first opening exposing a portion of the first region and a second opening exposing a portion of the second region. The method 20 further includes an operation 206, removing portions of the substrate to form a first trench in the first region through the first opening and to form a second trench in the second region through the second opening. The method 20 further includes an operation 208, performing an ion implantation to a portion of the patterned hard mask in the first region and a portion of the substrate exposed from the first trench in the first region. The method 20 further includes an operation 210, enlarging the first opening to form a third opening over the first trench and enlarging the second opening to form a fourth opening over the second trench. The method 20 further includes an operation 212, forming a first isolation by filling the first trench and a second isolation by filling the second trench. The method 20 will be further described according to one or more embodiments. It should be noted that the operations of the method 20 may be rearranged or otherwise modified within the scope of the various aspects. It is further noted that additional processes may be provided before, during, and after the method 20, and that some other processes may only be briefly described herein. Thus other implementations are possible within the scope of the various aspects described herein.

Figure 3B:
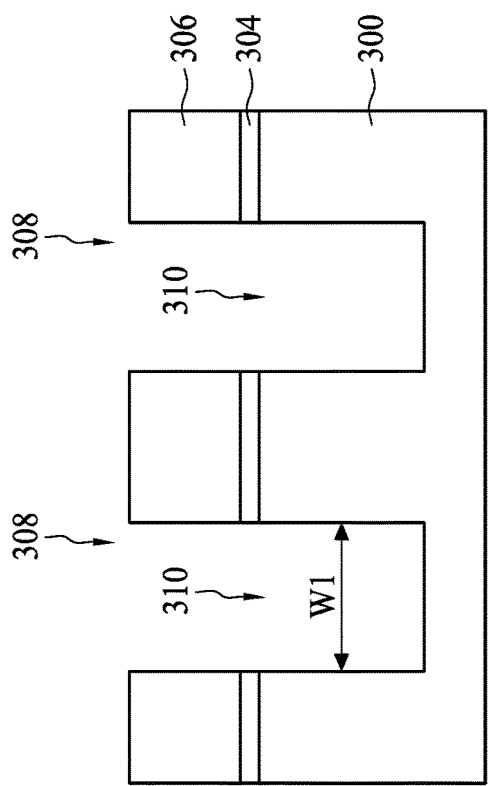
Figure 3A:
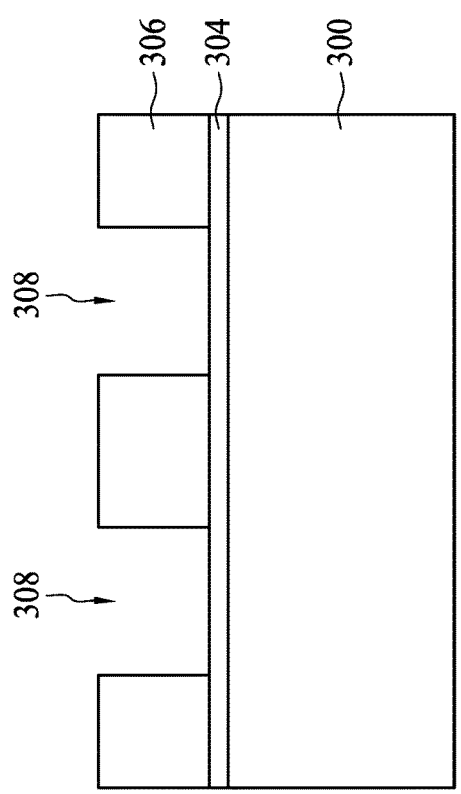

FIGS. 3A-3J are schematic drawings illustrating a semiconductor structure 30 including an isolation at various fabrication stages constructed according to aspects of the present disclosure in one or more embodiments. Referring to FIG. 3A, a substrate 300 is received or provided according to operation 102. In some embodiments, the substrate 300 includes silicon (Si). In some embodiments, other commonly used materials, such as carbon (C), germanium (Ge), gallium (Ga), arsenic (As), nitrogen (N), indium (In), and/or phosphorus (P), and the like, may also be included in the substrate 300. A pad layer 304 may be formed on the substrate 300. Next, a patterned hard mask 306 is formed over the substrate 300 according to operation 104. The pad layer 304 may be a thin film including silicon oxide (SiO) formed, for example, using a thermal oxidation process. The pad layer 304 may act as an adhesion layer between the substrate 300 and the patterned hard mask 306. The pad layer 304 may also act as an etch stop layer for etching the patterned hard mask 306 and a buffering layer buffering stress from the patterned hard mask 306. In some embodiments, the patterned hard mask 306 includes silicon nitride (SiN). In some embodiments, the patterned hard mask 306 includes at least a first opening 308 as shown in FIG. 3A.

Referring to FIG. 3B, at least a trench 310 is formed in the substrate 300 through the first opening 308 of the patterned hard mask 306 according to operation 106. As shown in FIG. 3B, at least a portion of the substrate 300 is exposed from the trench 310. The trench 310 defines a width W1. In some embodiments, the width W1 of the trench 310 can be between 1 micrometer (μm) and 10 μm, but the disclosure is not limited to this.

Figure 3D:
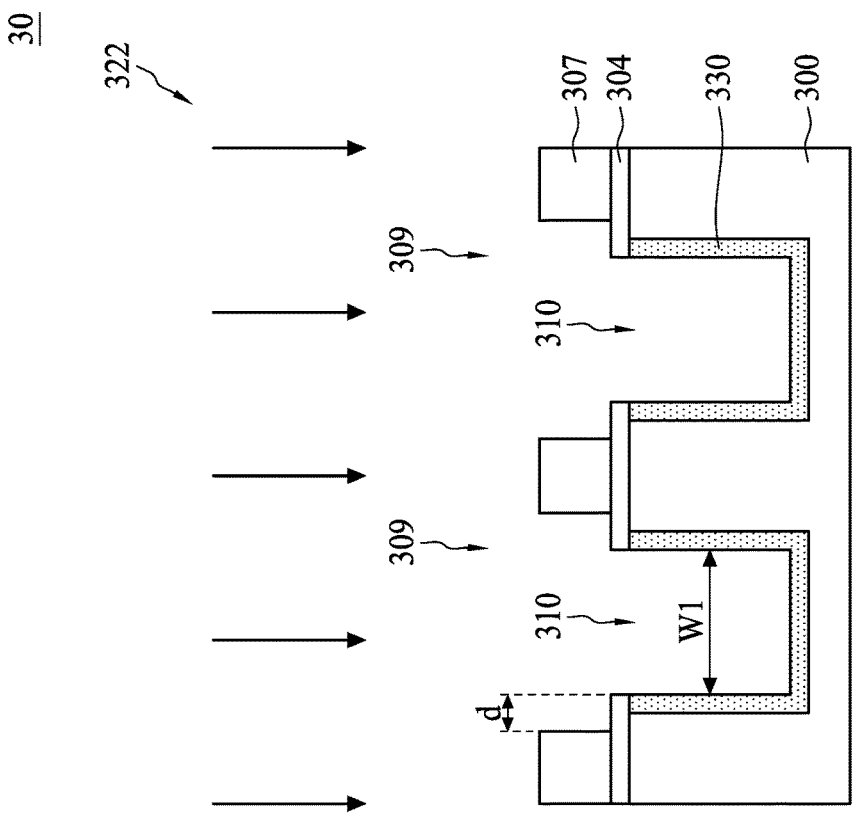
Figure 3C:
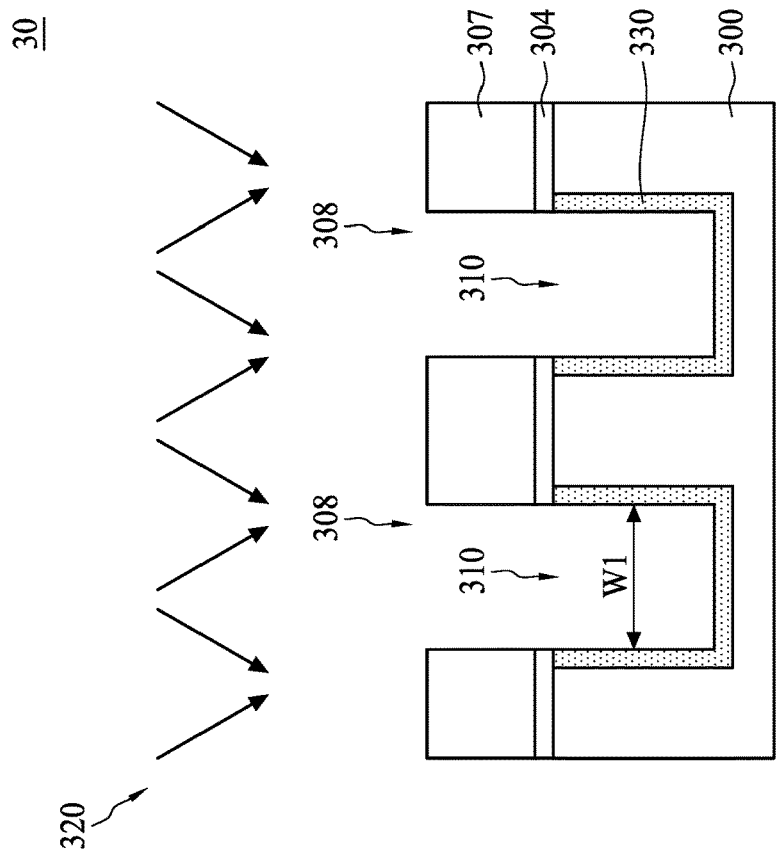

Referring to FIG. 3C, an ion implantation 320 is performed to the patterned hard mask 306 and the portion of the substrate 300 exposed from the trench 310 according to operation 108. Further, the ion implantation 320 is performed to form a doped region 330 in the substrate 300. In some embodiments, the ion implantation 320 is performed at a tilted angle as shown in FIG. 3C. In some embodiments, the ion implantation 320 includes implanting N, but the disclosure is not limited to this. In some embodiments, the ion implantation 320 includes implanting heavy ions having an atomic mass greater than an atomic mass of the substrate 300, or greater than 30 a.m.u., but the disclosure is not limited to this. For example, the heavy ion can include Ge or Ar, but the disclosure is not limited to this. The heavy ion such as, for example, Ge creates a substantial lattice disruption in the substrate 300 exposed from the trench 310, thereby rendering portions thereof amorphized. Accordingly, the doped region 330, which may be an amorphized region, is formed in the substrate 300 along sidewalls and a bottom of the trench 310, as shown in FIG. 3C. In some embodiments, the doped region 330 or the amorphized region defines a depth, and the depth is between about 50 angstroms (Å) and about 200 Å, but the disclosure is not limited thereto. Further, the ion implantation 320 damages the patterned hard mask 306, and thus physical and/or chemical characteristics of the patterned hard mask 306 is changed or altered, and a patterned hard mask 307 implanted by the ion implantation 320 is obtained. In some embodiments, the patterned hard mask 306 includes an original etching rate with respect to an etchant, and the patterned hard mask 307 includes an altered etching rate with respect to the etchant. In some embodiments, the altered etching rate is greater than the original etching rate due to the damage caused by the ion implantation 320.

Referring to FIG. 3D, in some embodiments, an enlarged second opening 309 over the trench 310 is formed through a pullback process 322 according to operation 110. In some embodiments, the pullback 322 is performed by an etchant, such as $H_3PO_4$, but the disclosure is not limited to this. Accordingly, the first opening 308 and the second opening 309 include a width difference "d", as shown in FIG. 3D.

Figures 3E, 3F:
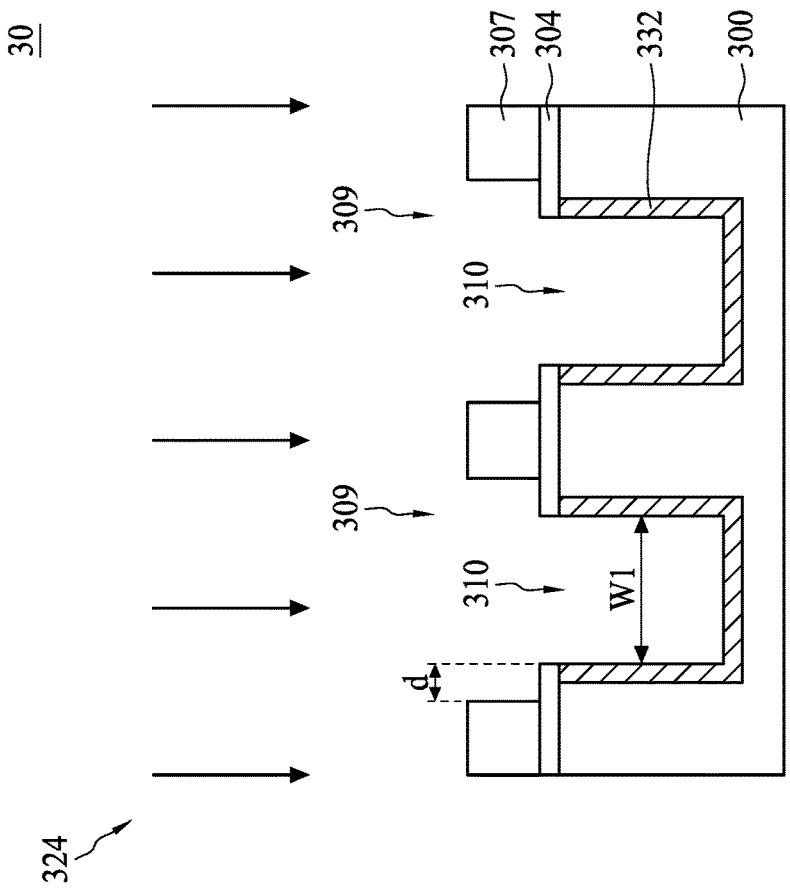

Referring to FIG. 3E, an oxidation and a thermal operation 324 can be performed after the pullback 322 in some embodiments. In some embodiments, the oxidation and the thermal operation 324 repair the damage at the surface of the doped region 330 exposed from the trench 310 caused by the pullback 322. Further, lattice disruption of the doped region 330 that is damaged by the ion implantation 320 can be repaired by the thermal operation 324, and thus a doped region 332 with repaired lattice is obtained. In some embodiments, the doped region 320, which was previously an amorphized region, can be fully re-crystallized by the thermal operation 324. In some embodiments, an oxide liner (not shown) is formed over the surfaces of the doped region 332 exposed from the trench 310.

Please refer to FIG. 3F. Next, the operation 112 is performed to form an isolation 342 by filling the trench 310. In some embodiments, the trench filling process may include forming an insulating material 340 to fill the trench 310 after the thermal operation 324. In some embodiments, a planarization operation can be performed, such that a top surface of the insulating material 340 is substantially flush with a top surface of the patterned hard mask 307.

Figure 3H:
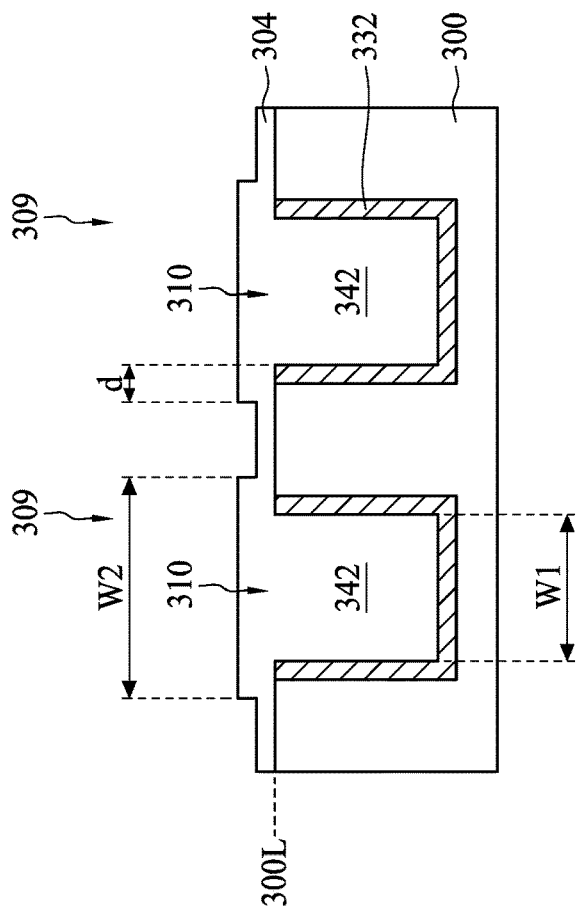
Figure 3G:
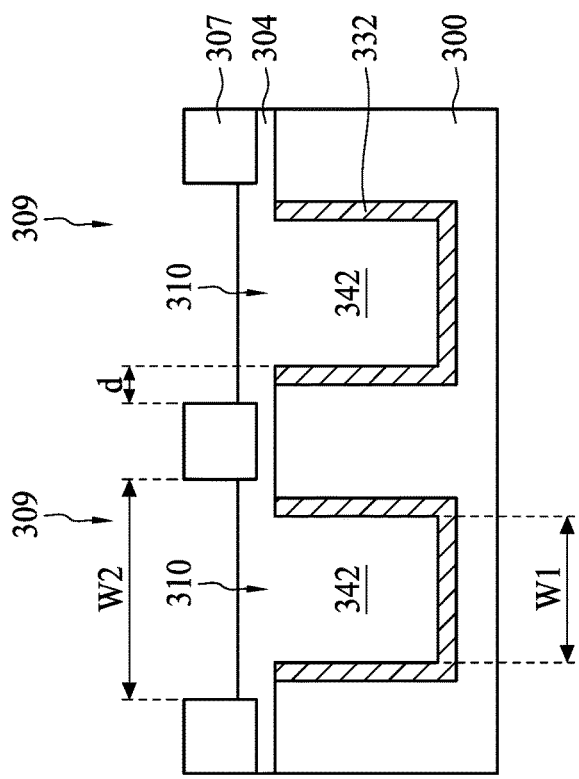

Referring to FIG. 3G, next, a portion of the insulating material 340 is removed to form the isolation 342, such that a top surface of the isolation 342 becomes lower than the top surface of the patterned hard mask 307. Still referring to FIG. 3G, a width W2 of the upper portion of the isolation 342 (i.e., the portion occupying in the second opening 309) is greater than a width W1 of the lower portion of the isolation 342 (i.e., the portion filling the trench 310).

Referring to FIG. 3H, the patterned hard mask 307 is then removed. Consequently, the pad layer 304 and the isolation 342 are exposed as shown in FIG. 3H. In some embodiments, well implantation and anneal can be performed to form an n-well or a p-well in the substrate 300. It should be easily understood that the conductivity type, the implant concentration, and the implant energy of the well implantation depend on different well requirements, therefore those details are omitted in the interest of brevity. In some embodiments, the isolation 342 includes a lower portion in the trench 310 and an upper portion above a surface line 300L of the substrate 300. The lower portion includes the width W1, the upper portion includes the width W2, and width difference d between the width W1 and the width W2 is obtained, as shown in FIG. 3H.

Referring to FIG. 3I, the pad layer 304 is then removed. In some embodiments, sacrificial oxide formation and removal can be repeatedly performed to repair the exposed surface of the substrate 300. Accordingly, portions of the isolation 342 may be consumed or removed. Due to the width difference d between the width W1 and the width W2, the insulating material 340 of the isolation 342 can be consumed without causing divot around top corners of the isolations 342.

Referring to FIG. 3J, a gate structure 350 can be formed over the substrate 300. In some embodiments, a gate dielectric layer (not shown) can be formed over the substrate 300 and followed by forming a gate conductive layer (not shown) thereon. A patterning operation is subsequently performed to form the gate structure 350 including the gate dielectric layer and the gate conductive layer.

According to the method depicted above, the width difference d can be easily increased by performing the ion implantation 320. Consequently, divot issue at the interface between the substrate 300 and the top corner of the isolation structure 342 may be mitigated and thus performance of the device can be improved.

Figure 4A:
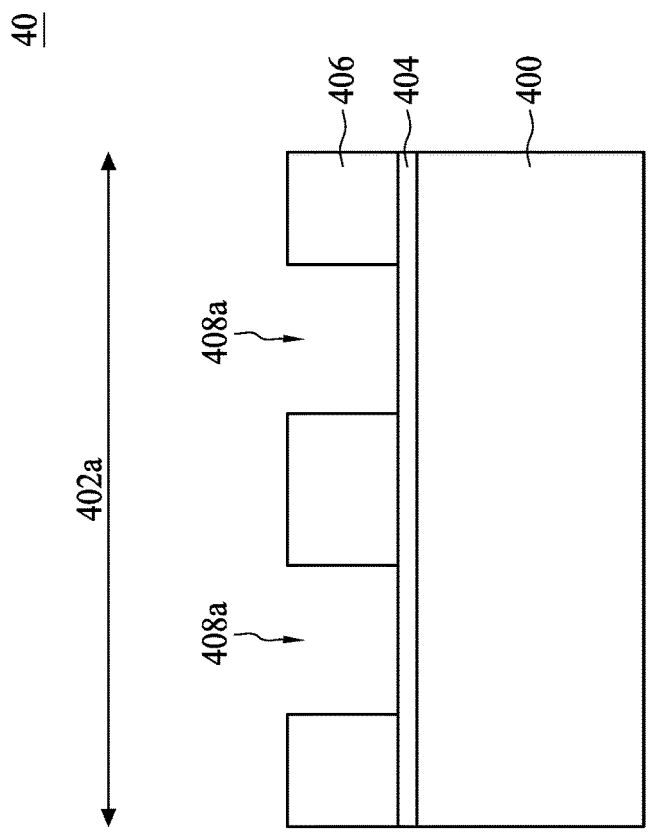
FIGS. 4A-4J are schematic drawings illustrating a semiconductor structure including isolations at various fabrication stages constructed according to aspects of the present disclosure in one or more embodiments.
Figure 4A:
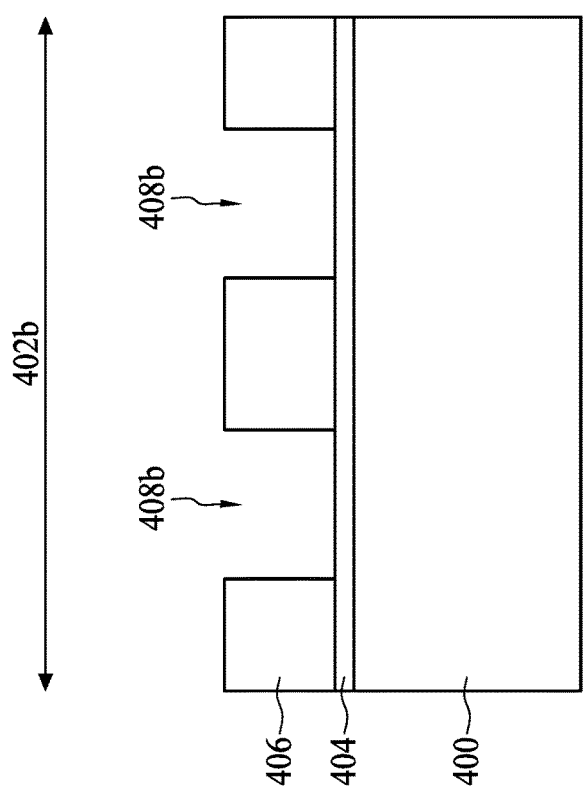

FIGS. 4A-4J are schematic drawings illustrating a semiconductor structure including isolations at various fabrication stages constructed according to aspects of the present disclosure in one or more embodiments. It should be easily understood that same elements in FIGS. 4A-4J and FIGS. 3A-3J can include same material thus those details are omitted in the interest of brevity. Referring to FIG. 4A, a substrate 400 is received or provided according to operation 202. In some embodiments, the substrate 400 includes a first region 402a and a second region 402b according to operation 202. The first region 402a and the second region 402b may be different functional regions, such as one of a memory region (such as an embedded static random access memory (SRAM) region), an analog region, an input/output (also referred to as a peripheral) region, a dummy region (for forming dummy patterns), and the like. The above-referenced device regions are also schematically illustrated in FIGS. 5 and 6. In an exemplary embodiment, the first region 402a is an analog region, while the second region 402b is a logic core region, but the disclosure is not limited to this.

Still referring to FIG. 4A, a pad layer 404 may be formed on the substrate 400. Next, a patterned hard mask 406 is formed over the substrate 400 according to the operation 204. As mentioned above, the pad layer 404 may act as an adhesion layer between the substrate 400 and the patterned hard mask 406. The pad layer 404 may also act as an etch stop layer for etching the patterned hard mask 406 and a buffering layer buffering stress from the patterned hard mask 406. In some embodiments, the patterned hard mask 406 includes at least a first opening 408a exposing a portion of the first region 402a and a second opening 408b exposing a portion of the second region 402b according to operation 204.

Figure 4B:
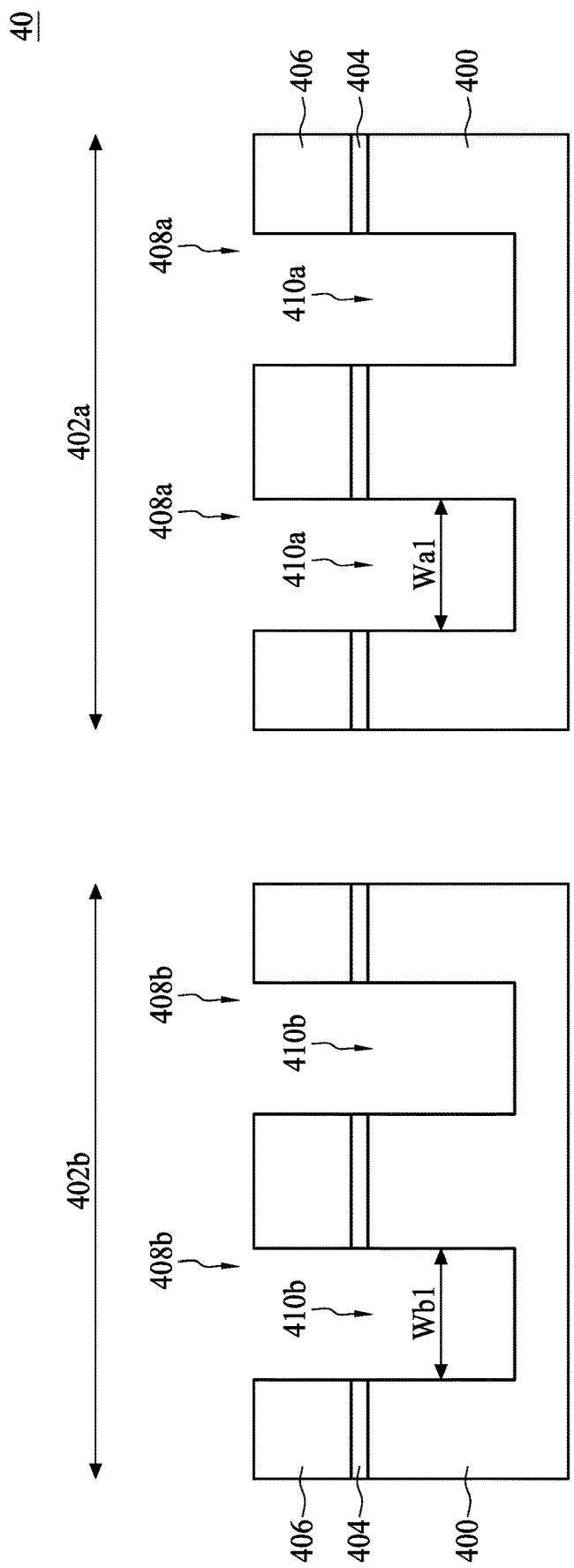

Referring to FIG. 4B, portions of the substrate 400 is removed according to the operation 206. In some embodiments, a first trench 410a is formed in the first region 402a through the first opening 408a of the patterned hard mask 406 and a second trench 410b is formed in the second region 402b through the second opening 408b of the patterned hard mask 406. Accordingly, a portion of the substrate 400 is exposed from the first trench 410a, and a portion of the substrate 400 is exposed from the second trench 410b. In some embodiments, a depth of the first trench 410a and a depth of the second trench 410b can be substantially the same, but the disclosure is not limited to this. Further, the first trench 410a defines a width Wa1 and the second trench 410b defines a width Wb1. In some embodiments, the width Wa1 of the first trench 410a and the width Wb1 of the second trench 410b can be substantially the same. In some embodiments, the width Wa1 of the first trench 410a can be different from the width Wb1 of the second trench 410b. In some embodiments, when the first region 402a is the analog region and the second region 402b is the logic core region, the width Wa1 of the first trench 410a can be greater than the width Wb1 of the second trench 410b. In some embodiments, a ratio of the width Wa1 over the width Wb1 can be between about 10 and about 500, but the disclosure is not limited to this. For example, the width Wa1 of the first trench 410a is between 1 µm and 10 µm, and the width Wb1 of the second trench 410b is between 20 nanometers (nm) and 100 nm, but the disclosure is not limited to this. In other words, the width Wa1 of the first trench 410a can be much greater than the width Wb1 of the second trench 410b in some embodiments. However, for the purpose of clearly showing the features, the width Wb1 of the second trench 410b is amplified in FIGS. 4A-4J.

Figure 4C:
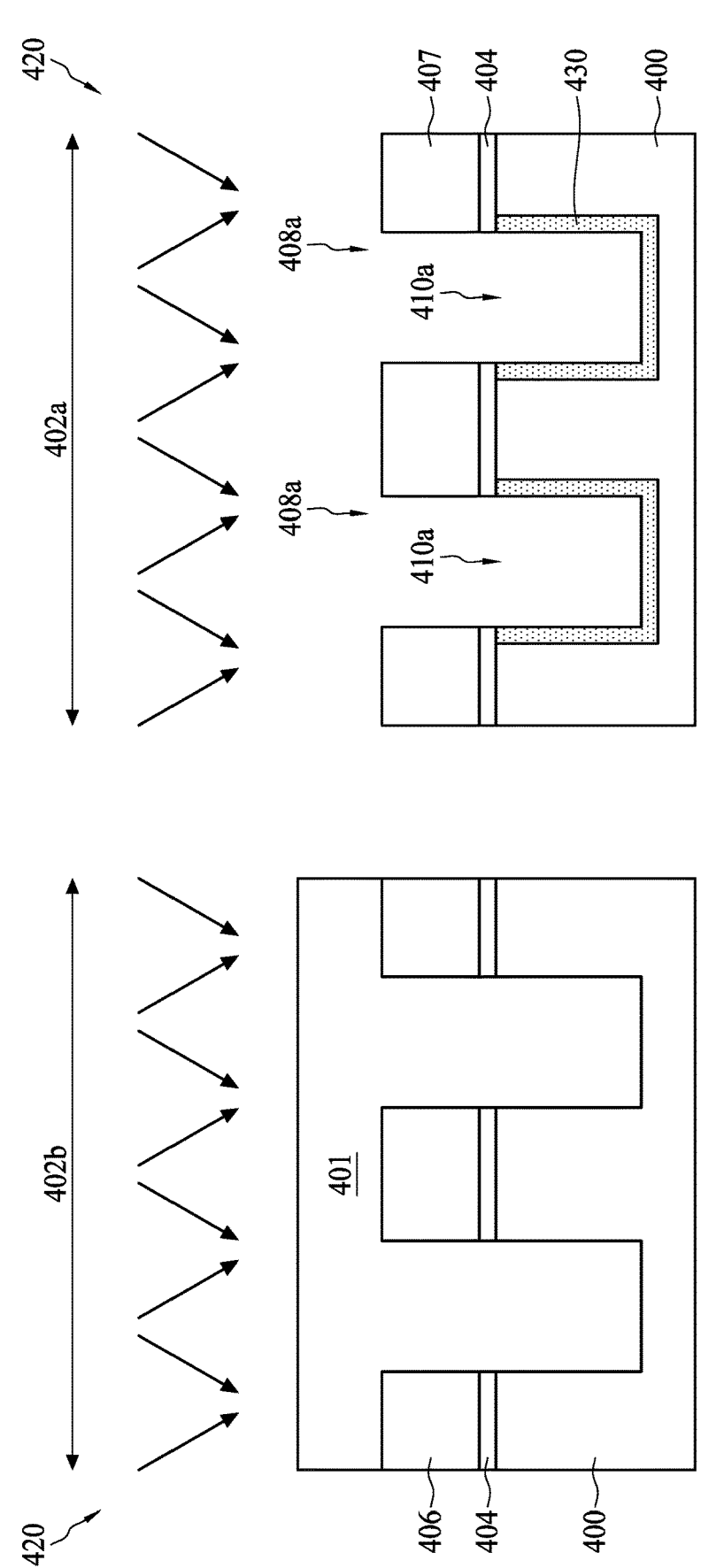

Referring to FIG. 4C, next, a protecting layer 401 is formed over the substrate 400. Specifically, the protecting layer 401 is formed over the second region 402b and left the first region 402a being exposed. In some embodiments, the protecting layer 401 includes photoresist, but the disclosure is not limited to this. After forming the protecting layer 401, an ion implantation 420 is performed according to the operation 208. The ion implantation 420 is performed to a portion of the patterned hard mask 406 in the first region 402a and a portion of the substrate 400 exposed from the first trench 410a in the first region 402a. In some embodiments, the ion implantation 420 is performed at a tilted angle as shown in FIG. 4C. In some embodiments, the ion implantation 420 includes implanting N, but the disclosure is not limited to this. In some embodiments, the ion implantation 420 includes implanting heavy ion having an atomic mass greater than an atomic mass of the substrate 400, or greater than 30 a.m.u., but the disclosure is not limited to this. For example, the heavy ion can include Ge or Ar, but the disclosure is not limited to this. The heavy ion such as, for example, Ge creates a substantial lattice disruption in the substrate 400, thereby rendering portions thereof amorphized. Accordingly, a doped region 430, which may be an amorphized region, is formed in the substrate 400 along sidewalls and a bottom of the first trench 410a, as shown in FIG. 4C. In some embodiments, the doped region 430 or the amorphized region defines a depth, and the depth is between about 50 Å and about 200 Å, but the disclosure is not limited thereto. Further, the ion implantation 420 damages the portion of the patterned hard mask 406 in the first region 402a exposed from the protecting layer 401, therefore physical and/or chemical characteristics of the portion of the patterned hard mask 406 in the first region 402a is changed or altered, and a patterned hard mask 407 implanted by the ion implantation 420 is formed. In some embodiments, the physical and/or chemical characteristics of the patterned hard mask 407 being implanted may be different from that of the pattered hard mask 406 protected by the protecting layer 401 in the second region 402b. In some embodiments, the patterned hard mask 407 in the first region 402a therefore includes a first etching rate with respect to an etchant after the ion implantation 420, the patterned hard mask 406 in the second region 402b includes a second etching rate with respect to the etchant after the ion implantation 420. More importantly, the first etching rate of the patterned hard mask 407 in the first region 402a is greater than the second etching rate of the patterned hard mask 406 in the second region 402b.

Figure 4D:
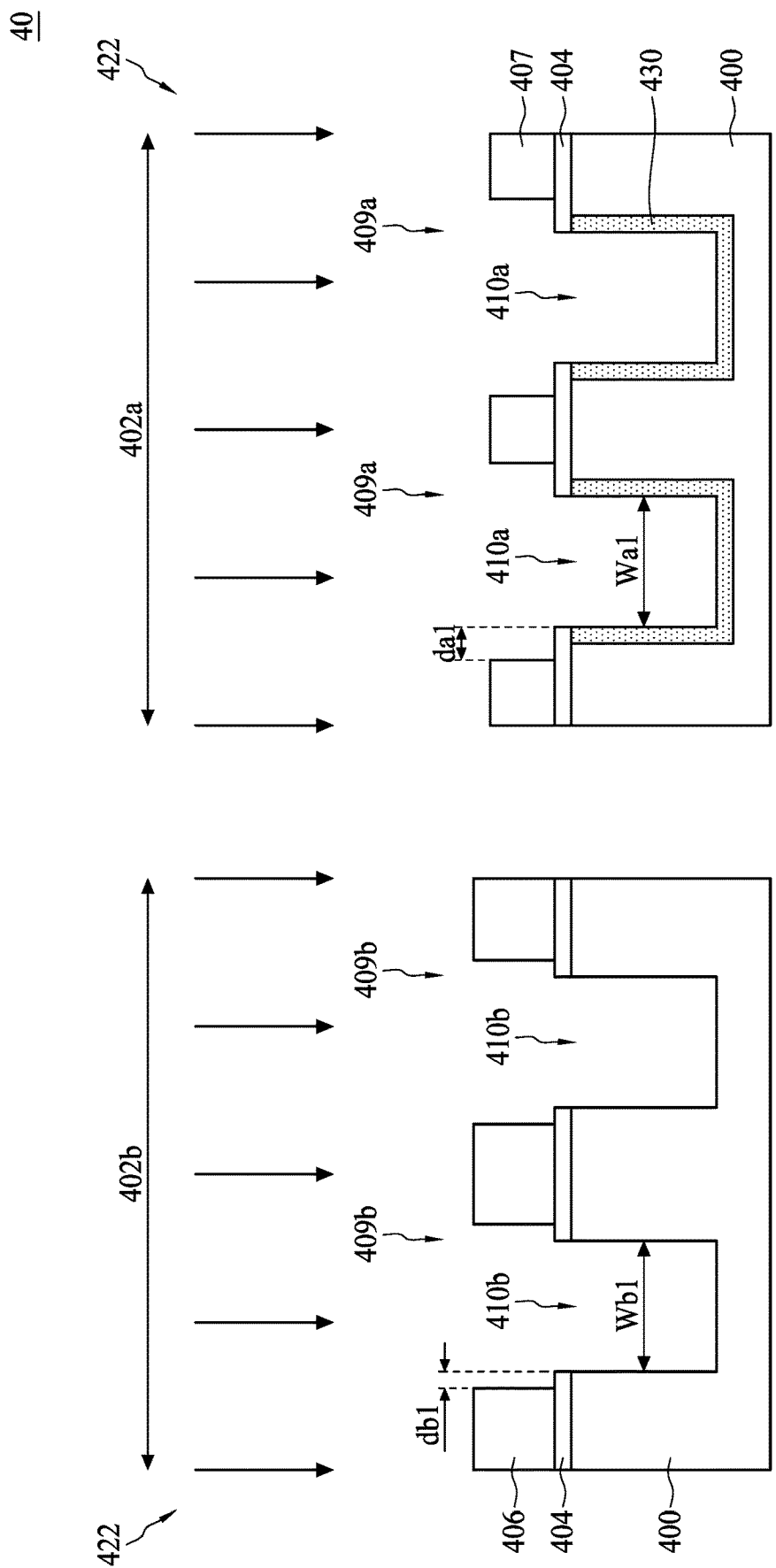

Referring to FIG. 4D, the protecting layer 401 is removed after performing the ion implantation 420. Next, an enlarged third opening 409a over the first trench 410a is formed through a pullback 422, and an enlarged fourth opening 409b over the second trench 410b is formed through the pullback 422, according to operation 210. In some embodiments, the pullback 422 is performed by an etchant, such as $H_3PO_4$, but the disclosure is not limited to this. As mentioned above, since the etching rate of the pattered hard mask 407 in the first region 402a is greater than the etching rate of the patterned hard mask 406 in the second region 402b, the portion being removed from the pattered hard mask 407 is more than the portion being removed from the pattered hard mask 406 even with the same etchant. Accordingly, the first opening 408a and the third opening 409a define a width difference "da1", the second opening 408b and the fourth opening 409b define a width difference "db1", and the width difference da1 is greater than the width difference db1, as shown in FIG. 4D. In some embodiments, since the pullback 422 is performed to simultaneously obtain at least two width differences (the width difference da1 and the width difference db1), such pullback is referred to as a double pullback or a dual pullback 422.

Figure 4E:
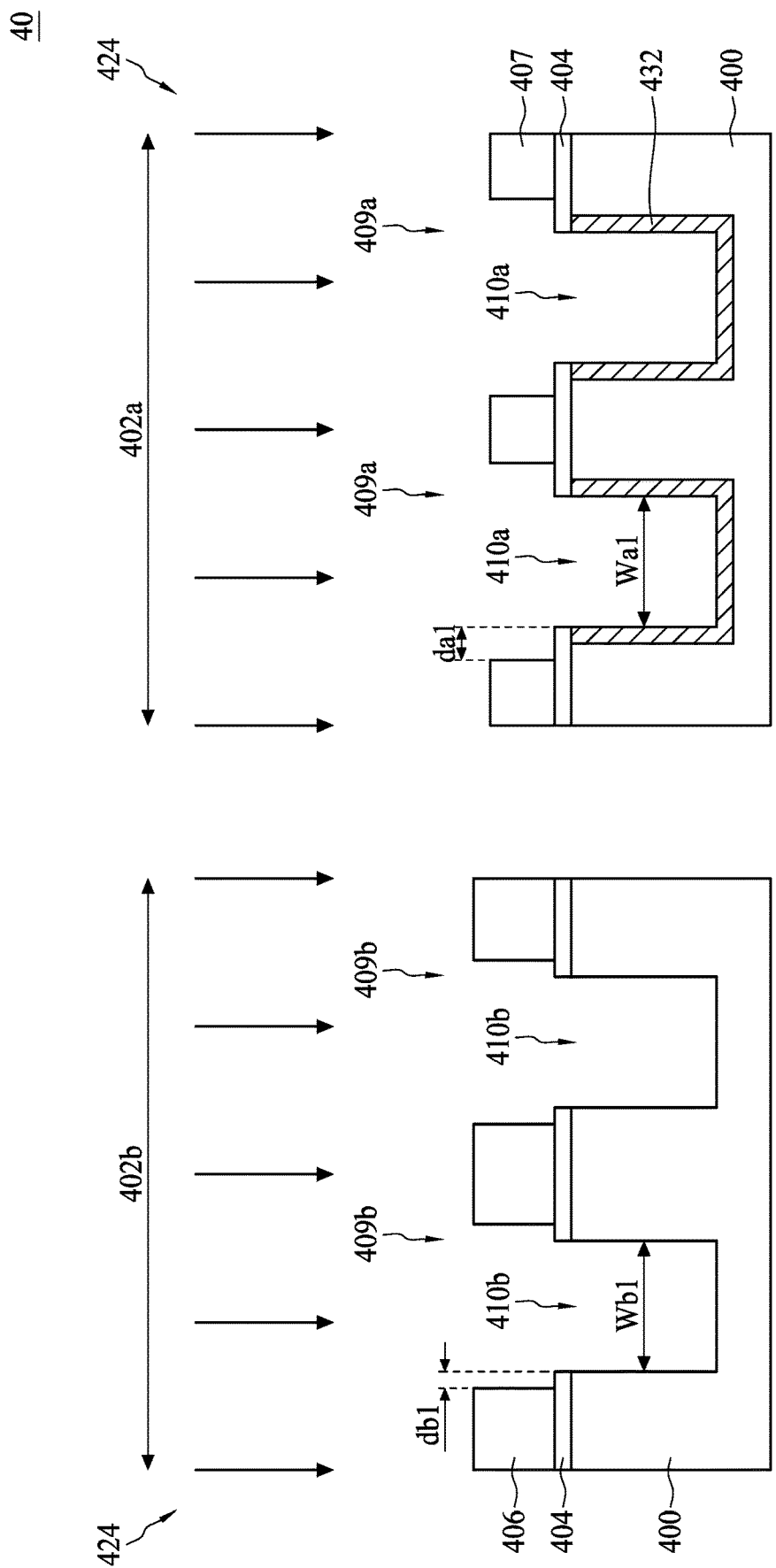

Referring to FIG. 4E, an oxidation and a thermal operation 424 can be performed in some embodiments after the dual pullback 422. In some embodiments, the oxidation and the thermal operation 424 repair the damage at the surface of the substrate 400 exposed from the second trench 410b and the surface of the doped region 430 exposed from the first trench 410a caused by the dual pullback 422. Further, lattice disruption of the doped region 430 that is damaged by the ion implantation 420 can be repaired by the thermal operation 424, and thus a doped region 432 with repaired lattice is obtained. In some embodiments, the doped region 430, which was previously an amorphized region, can be fully re-crystallized by the thermal operation 424. In some embodiments, an oxide liner (not shown) is formed over the surfaces of the doped region 432 exposed from the first trench 410a and the surfaces of the substrate 400 exposed from the second trench 410b.

Figure 4F:
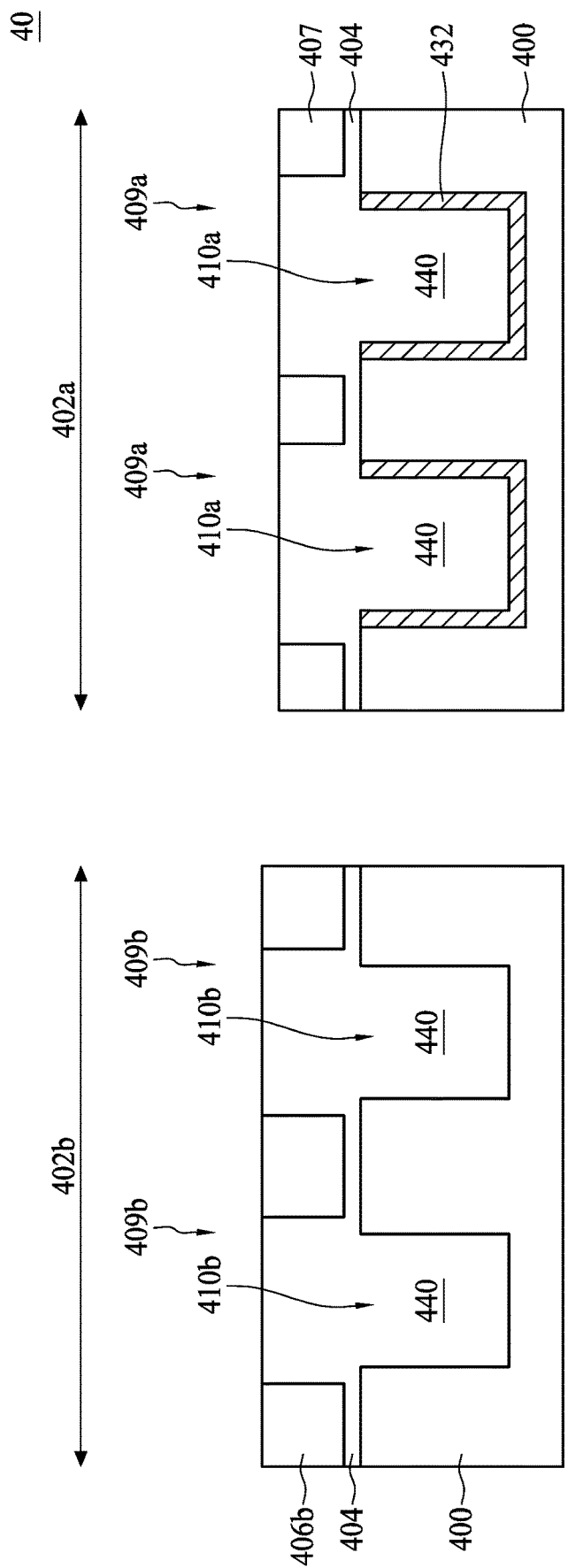

Please refer to FIG. 4F. Next, the operation 212 is performed to form a first isolation 442a by filling the first trench 410a and a second isolation 442b by filling the second trench 410b. In some embodiments, the trench filling process may include forming an insulating material 440 to fill the first trench 410a and the second trench 410b after the thermal operation 424. In some embodiments, a planarization operation can be performed, such that a top surface of the insulating material 440 is substantially flush with a top surface of the patterned hard mask 406 and a top surface of the patterned hard mask 407.

Figure 4G:
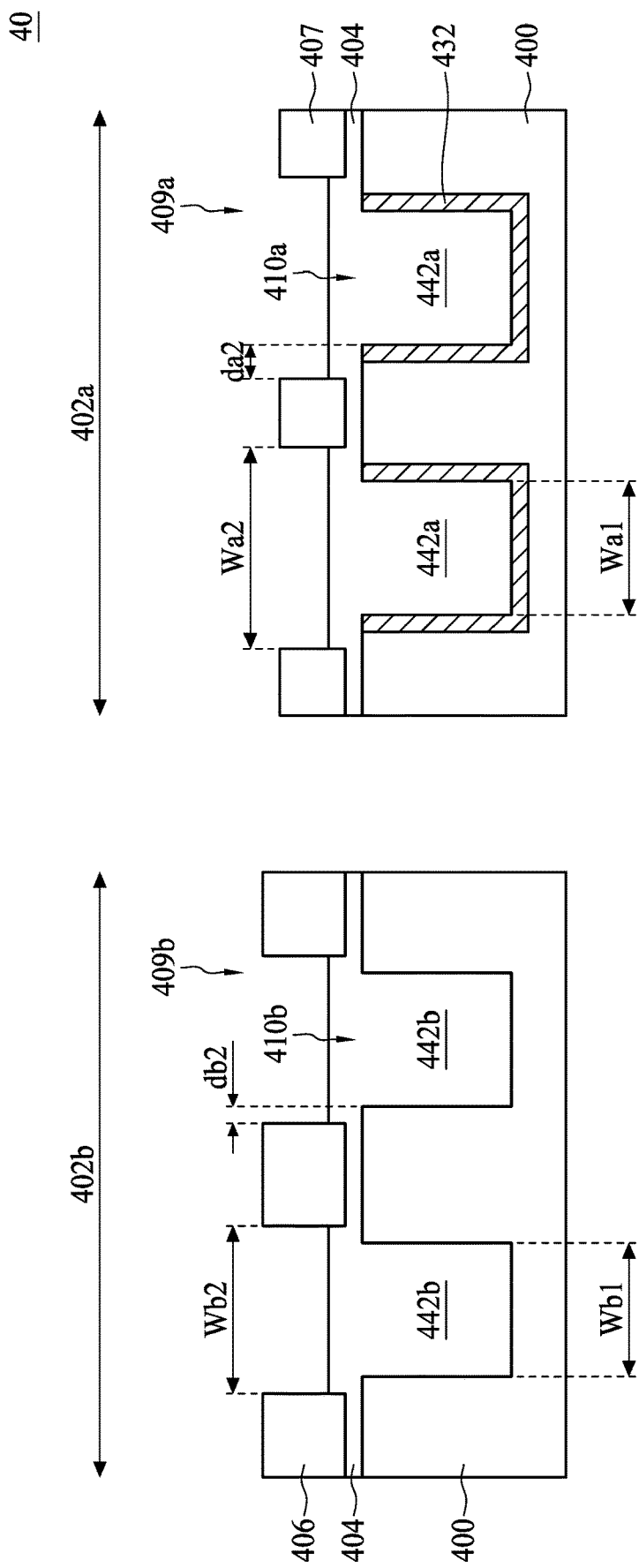

Referring to FIG. 4G, next, a portion of the insulating material 440 is removed, such that a top surface of the insulating material 440 is lower than the top surface of the patterned hard mask 406 and the top surface of the patterned hard mask 407. As shown in FIG. 4G, a width Wa2 of the upper portion of the first isolation 442a (i.e., the portion occupying in the third openings 409a) is greater than a width Wa1 of the lower portion of the first isolation 442a (i.e., the portion filling the first trench 410a). And a width Wb2 of the upper portion of the second isolation 442b (i.e., the portion occupying in the fourth openings 409b) is greater than a width Wb1 of the lower portion of the second isolation 442b (i.e., the portion filling the second trench 410b). However, since the width difference da1 is greater than the width difference db1, a width difference da2 between the width Wa1 and the width Wa2 is greater than a width difference db2 between the width Wb1 and the width Wb2, as shown in FIG. 4G.

Figure 4H:
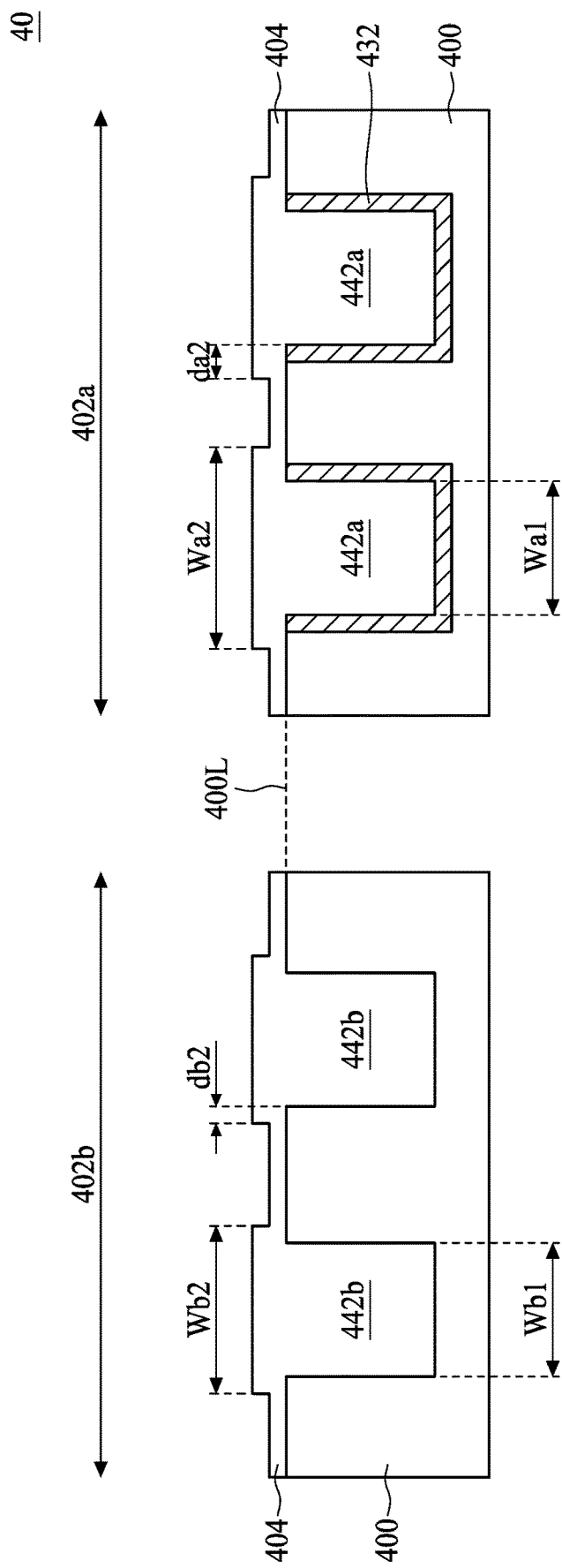

Referring to FIG. 4H, the patterned mask 407 is then removed. Consequently, the pad layer 404, the first isolation 442a and the second isolation 442b are exposed as shown in FIG. 4H. In some embodiments, different well implantation and anneal can be performed. For example, an n-typed core well implantation or a p-typed core well implantation, and an anneal can be performed to form an n-well or a p-well in the second region 402b when the second region 402b is the logic core region. For example, an n-typed logic well implantation or a p-typed logic well implantation, and an anneal can be performed to form an n-well or a p-well in the first region 402a when the second region 402b is the analog region. It should be easily understood that the conductivity type, the implant concentration, and the implant energy of the well implantation depend on different well requirements, therefore those details are omitted in the interest of brevity. In some embodiments, the first isolation 442a includes a lower portion in the first trench 410a and an upper portion above a surface line 400L of the substrate 400. The lower portion includes the width Wa1, and the upper portion includes the width Wa2. Similar, the second isolation 442b includes a lower portion in the second trench 410b and an upper portion above the surface line 400L of the substrate 400. The lower portion includes the width Wb1, the upper portion includes the width Wb2. As mentioned above, the width difference da2 between the width Wa1 and the width Wa2 is greater than the width difference db2 between the width Wb1 and the width Wb2, as shown in FIG. 4H.

Figure 4I:
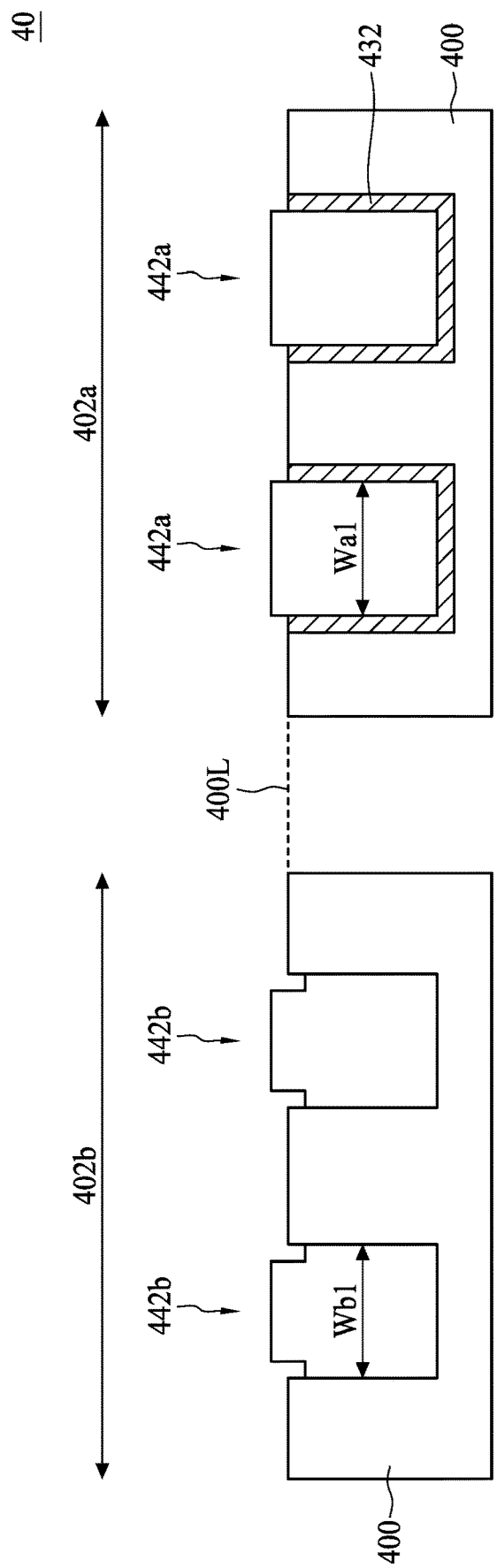

Referring to FIG. 4I, the pad layer 404 is then removed. In some embodiments, sacrificial oxide formation and removal can be repeatedly performed to repair the exposed surface of the substrate 400. Accordingly, portions of the first isolation 442a and portion of the second isolation 442b may be removed. As mentioned above, the ratio of the width Wa1 over the width Wb1 is between about 50 and about 100, therefore micro loading effect may cause different etching results in the first region 402a and the second region 402b. For example, due to micro loading effect, the first isolation 442a (which includes greater width Wa1 and Wa2) is consumed much more than the second isolation 442b. However, since the width difference da2 between the width Wa1 and the width Wa2 is greater than the difference db2 between the width Wb1 and the width Wb2, the insulating material 440 can be consumed without causing divot around top corners of the first isolations 442a. In some embodiments, a top portion of the first isolation 442a is different from a top portion of the second isolation 442b. For example, divot may be formed around the top corners of the second isolations 442b. In other embodiments, the insulating material 440 can also be consumed without causing divot around top corners of the second isolations 442b.

Figure 4J:
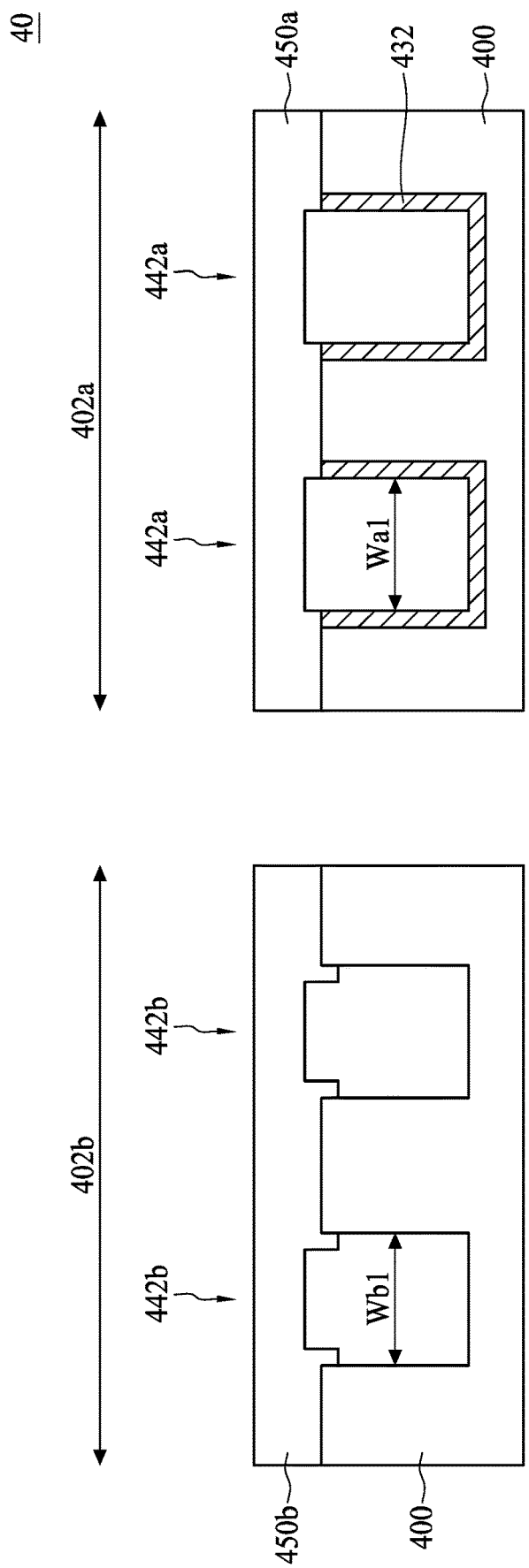

Referring to FIG. 4J, a first gate structure 450a can be formed in the first region 402a and a second gate structure 450b can be formed in the second region 402b. In some embodiments, a gate dielectric layer (not shown) can be formed over the substrate 400 and followed by forming a gate conductive layer (not shown) thereon. A patterning operation is subsequently performed to form the first gate structure 450a including the gate dielectric layer and the gate conductive layer in the first region 402a. Simultaneously, the second gate structure 450b including the gate dielectric layer and the gate conductive layer is formed in the second region 402b. In some embodiments, since the first gate structure 450a and the second gate structure 450b are formed for difference devices in different regions, a width of the first gate structure 450a can be different from a width of the second gate structure 450b, but the disclosure is not limited to this.

In some embodiments, a semiconductor structure 40 is formed as shown in FIG. 4J. The semiconductor structure 40 includes the substrate 400 including the first region 402a and the second region 402b defined thereon, the first isolation 442a in the substrate 400 in the first region 402a, the second isolation 442b in the substrate 400 in the second region 402b, and the doped region 432 surrounding the first isolation 442a in the substrate 400. In some embodiments, the semiconductor structure 40 further includes the first gate structure 450a disposed over the first region 402a and the second gate structure 450b disposed over the second region 402b. As mentioned above, the first region 402a and the second region 402b may be different functional regions, such as one of a logic core region, a memory region, an analog region, an input/output region, a dummy region, and the like. In an exemplary embodiment, the first region 402a is an analog region, while the second region 402b is a logic core region, but the disclosure is not limited to this. In some embodiments, the region 432 and the substrate 400 may be different in composition. For example, the substrate 400 includes a first material such as Si, while the region 432 includes the first material the same as the substrate 400 and a second material such as Ge, N or Ar. In some embodiments, the second material has an atomic mass greater than an atomic mass of the first material. In some embodiments, a bottom and sidewalls of the first isolation 442a are in contact with the region 432 while a bottom and sidewalls of the second isolation 442b are in contact with the substrate 400, as shown in FIG. 4J. In some embodiments, the doped region 432 includes heavy ions. For example, the doped region 432 can include Ge, N, or Ar, but the disclosure is not limited to thus. In some embodiments, the width Wa1 of the first isolation 442a is greater than the width Wb1 of the second isolation 442b. Still referring to FIG. 4J, in some embodiments, a top portion of the first isolation 442a is different from a top portion of the second isolation 442b. For example, the second isolation 442b includes a divot around a top corner, and the first isolation 442a includes a divot-free top corner.

Still referring to FIG. 4J, it should be noted that the first gate structure 450a extends over the top portion of the first isolation 442a and the second gate structure 450b extends over the top portion of the second isolation 442b. Since the first isolation 442a includes a divot-free top corner, the concentrated or crowding electrical field is mitigated at the corner of the transistor devices serving as analog devices. Thus stability of threshold voltage (Vt) at the corner of the analog devices is improved. Consequently, the unwanted noise caused by divot is reduced, and performance of analog circuit is improved by the noise reduction. More importantly, the divot issue in the first region 402a is mitigated without affecting the second region 402b, which is susceptible to damage during the operations. Different from the analog devices, the logic devices in the second regions 402b are configured to act as switches between on and off so as to enable logical functionality for an integrated chip (e.g. form a processor configured to perform logic functions). Therefore, the noise issue does not impact the logic devices as much as they do to the analog devices. Accordingly, divot is acceptable or tolerable in the second region 402b.

Figure 5:
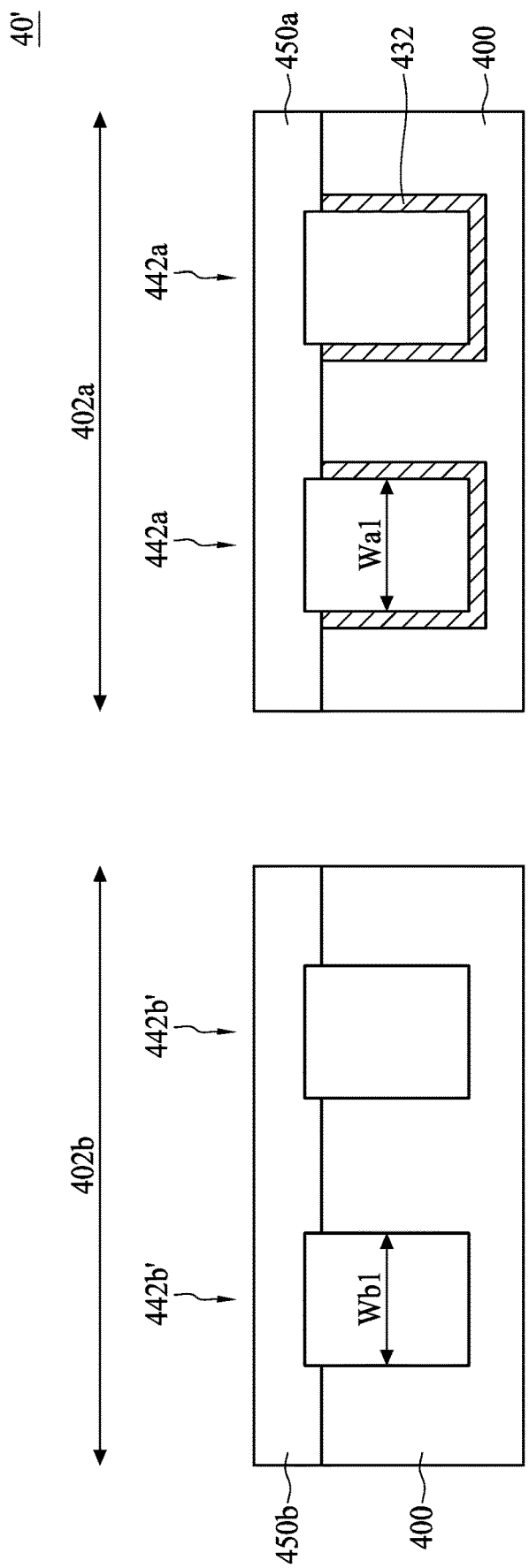
FIG. 5 is a schematic drawing illustrating a semiconductor structure including isolations according to aspects of the present disclosure in one or more embodiments.

Referring to FIG. 5, which is a schematic drawing illustrating a semiconductor structure 40' including the isolations according to aspects of the present disclosure in one or more embodiments. It should be easily understood that same elements in FIG. 5 and FIG. 4J are designated by the same numerals. And the same elements in the semiconductor structure 40 and the semiconductor structure 40' can include the same material and/or formed by the same operations, thus those details are omitted in the interest of brevity, and only the differences are detailed.

As mentioned above, during forming and removing the sacrificial oxide layer, the first isolation 442a and the second isolations 442b' may suffer consumption. Also as mentioned above, due to the width difference da2 between the width Wa1 and the width Wa2 caused by the dual pullback 422, the insulating material 440 can be consumed without causing divot around top corners of the first isolations 442a. Similar, in some embodiments, due to the width difference db2 between the width Wb1 and the width Wb2 caused by the dual pullback 422, the insulating material 440 can be consumed without causing divot around top corners of the second isolations 442b'. Accordingly, the first isolation 442a may include the width Wa1 greater than the width Wb1 of the second isolation 442b'. However, divot issue of both of the first isolation 442a and the second isolation 442b' can be mitigated. In some embodiments, both of the first isolation 442a and the second isolations 442b' include a divot-free top corner as shown in FIG. 5. Additionally, the semiconductor structure 40' still includes the doped region 432 in the substrate 400 in the first region 402a. As shown in FIG. 5, sidewalls and a bottom of the first isolation 442a are in contact with the doped region 432 while sidewalls and a bottom of the second isolation 442b' are in contact with the substrate 400, but the disclosure is not limited to this.

Still referring to FIG. 5, as mentioned above, the first gate structure 450a extends over the top portion of the first isolation 442a and the second gate structure 450b extends over the top portion of the second isolation 442b'. Since both of the first isolation 442a and the second isolation 442b' include a divot-free top corner, the concentrated or crowding electrical fields are mitigated at the corner of the transistor devices in both of the first region 402a and the second region 402b. Thus stability of threshold voltage (Vt) at the corner of the transistor devices is improved. Consequently, the unwanted noise caused by divot issue is reduced, and performance of, for example but not limited to, analog circuit is improved by the noise reduction. Further, performance of, for example but not limited to, logic core circuit may be improved by the improved Vt stability.

Figure 6:
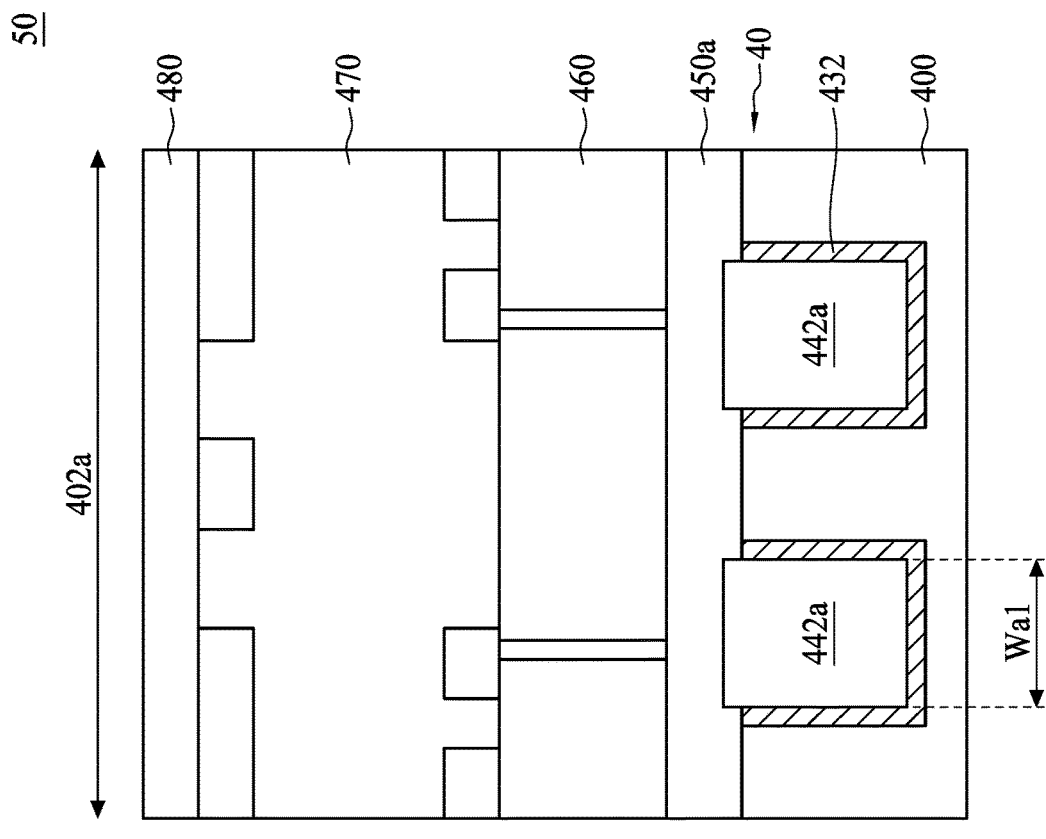
FIG. 6 is a schematic drawing illustrating a semiconductor device including a semiconductor structure including isolations according to aspects of the present disclosure in one or more embodiments.
Figure 6:
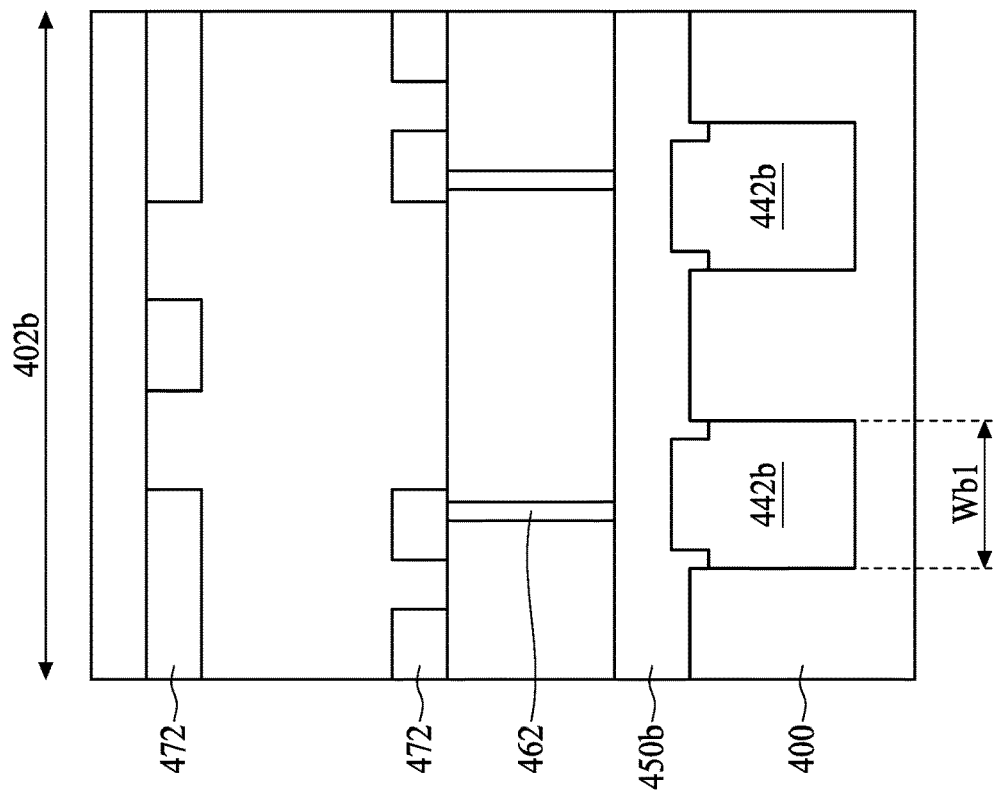

Referring to FIG. 6, which is a schematic drawing illustrating a semiconductor device 50 including the semiconductor structure 40 including the isolations 442a and 442b according to aspects of the present disclosure in one or more embodiments. It should be easily understood that same elements in FIG. 6 and FIG. 4J are designated by the same numerals. And the same elements in the semiconductor structure 40 and the semiconductor device 50 can include the same material and/or formed by the same operations, thus those details are omitted in the interest of brevity, and only the differences are detailed.

Still referring to FIG. 6, after forming the first gate structure 450a and the second gate structure 450b, other elements, such as source/drain extension regions, spacers, source/drain and salicides can be formed for constructing transistor devices. In some embodiments, other devices required by different products can be formed. Thereafter, inter-layer dielectric (ILD) layer 460 is formed over the substrate 400 and contacts 462 can be formed in the ILD layer 460. In some embodiments, inter-metal dielectric layers 470 and back-end-of-line (BEOL) metallization 472 can be formed over the substrate 400, and followed by forming a passivation layer 480 as shown in FIG. 6. Accordingly, the semiconductor device 50 including the semiconductor structure 40 is obtained.

Accordingly, the present disclosure provides a method for manufacturing a semiconductor structure including isolation 10 that is able to mitigate the divot issue. In some embodiments, the present disclosure provides a method for manufacturing a semiconductor structure including isolations 20 that is able to mitigate the divot issue in one region while other isolations in another region are impervious to such operations. Accordingly, isolations of different sizes are both improved and complied with requirements.

In some embodiments, a method for manufacturing a semiconductor structure including isolations is provided. The method includes receiving a substrate; forming a patterned hard mask over the substrate, the patterned hard mask including a first opening, forming at least a trench in the substrate through the first opening of the patterned hard mask, and at least a portion of the substrate is exposed from the trench; performing an ion implantation to the patterned hard mask and the portion of the substrate exposed from the trench to form a doped region in the substrate; enlarging the first opening by removing a portion of the patterned hard mask to form a second opening over the trench; and forming an isolation by filling the trench.

In some embodiments, a method for manufacturing a semiconductor structure including isolations is provided. The method includes receiving a substrate including a first region and a second region defined thereon; forming a patterned hard mask over the substrate, the patterned hard mask including a first opening exposing a portion of the first region and a second opening exposing a portion of the second region; removing portions of the substrate to form a first trench in the first region through the first opening and to form a second trench in the second region through the second opening; performing an ion implantation to a portion of the patterned hard mask in the first region and a portion of the substrate exposed from the first trench in the first region; enlarging the first opening to form a third opening over the first trench and enlarging the second opening to form a fourth opening over the second trench; and forming a first isolation by filling the first trench and a second isolation by filling the second trench.

In some embodiments, a semiconductor structure is provided. The semiconductor structure includes a substrate having a first region and a second region defined thereon, a first isolation in the first region, a second isolation in the second region, and a region surrounding the first isolation in the substrate. In some embodiments, the substrate includes a first material, and the region includes the first material and a second material. The first isolation includes a first width, and the second isolation structure includes a second width. In some embodiments, the first width is greater than the second width. In some embodiments, a bottom and sidewalls of the first isolation are in contact with the region, and a bottom and sidewalls of the second isolation are in contact with the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   receiving a substrate;
   forming a patterned hard mask over the substrate, the patterned hard mask comprising at least a first opening;
   forming at least a trench in the substrate through the first opening of the patterned hard mask, and at least a portion of the substrate being exposed from the trench;
   performing an ion implantation to the patterned hard mask and the portion of the substrate exposed from the trench to form a doped region in the substrate;
   enlarging the first opening by removing a portion of the patterned hard mask to form a second opening over the trench; and
   forming an isolation by filling the trench,
   wherein the forming of the isolation filling the trench further comprises:
     forming an insulating material to fill the trench, wherein a top surface of the isolation is lower than a top surface of the patterned hard mask; and
     removing the patterned hard mask.

2. The method of claim 1, wherein the ion implantation comprises implanting Ge, N, or Ar.

3. The method of claim 1, further comprising performing a thermal operation before forming the insulating material to fill the trench.

4. A method for manufacturing a semiconductor structure, comprising:
   receiving a substrate comprising a first region and a second region defined thereon;
   forming a patterned hard mask over the substrate, the patterned hard mask comprising a first opening exposing a portion of the first region and a second opening exposing a portion of the second region;
   removing portions of the substrate to form a first trench in the first region through the first opening and to form a second trench in the second region through the second opening, wherein a width of the first trench is greater than a width of the second trench;
   performing an ion implantation to a portion of the patterned hard mask in the first region and a portion of the substrate exposed from the first trench in the first region;
   enlarging the first opening to form a third opening over the first trench and enlarging the second opening to form a fourth opening over the second trench; and
   forming a first isolation filling the first trench and a second isolation filling the second trench.

5. The method of claim 4, further comprising forming a protecting layer over the second region before performing the ion implantation, and removing the protecting layer before enlarging the first opening and enlarging the second opening.

6. The method of claim 4, wherein the ion implantation comprises implanting Ge, N, or Ar.

7. The method of claim 4, wherein the patterned hard mask in the first region comprises a first etching rate with respect to an etchant after the ion implantation, the patterned hard mask in the second region comprises a second etching rate with respect to the etchant after the ion implantation, and the first etching rate is greater than the second etching rate.

8. The method of claim 4, wherein the first opening and the third opening comprise a first width difference, the second opening and the fourth opening comprise a second width difference, and the first width difference is greater than the second width difference.

9. The method of claim 4, wherein the forming the first isolation in the first trench and the second isolation in the second trench further comprises:
   performing a thermal operation;
   forming an insulating material to fill the first trench and the second trench, and a top surface of the insulating material being lower than a top surface of the patterned hard mask; and
   removing the patterned hard mask.

10. The method of claim 9, the ion implantation is performed to form a doped region in the first trench.

11. The method of claim 10, wherein the doped region is re-crystallized by the thermal operation.

12. The method of claim 4, wherein a top portion of the first isolation is different from a top portion of the second isolation.

13. A method for manufacturing a semiconductor structure, comprising:
   receiving a substrate comprising a first region and a second region defined thereon;
   forming a patterned hard mask over the substrate, the patterned hard mask comprising a first opening exposing a portion of the first region and a second opening exposing a portion of the second region;
   forming a first trench in the first region through the first opening and a second trench in the second region through the second opening;
   performing an ion implantation to a portion of the patterned hard mask in the first region and a portion of the substrate exposed from the first trench in the first region to form a doped region in the portion of the substrate exposed from the first trench;
   enlarging the first opening to form a third opening over the first trench and enlarging the second opening to form a fourth opening over the second trench;
   performing a thermal operation;

forming a first isolation filling the first trench and a second isolation filling the second trench;

removing the patterned hard mask; and forming a first gate structure over the first isolation and a second gate structure over the second isolation.

14. The method of claim 13, wherein a width of the first trench is greater than a width of the second trench.

15. The method of claim 13, wherein the patterned hard mask in the first region comprises a first etching rate with respect to an etchant after the ion implantation, the patterned hard mask in the second region comprises a second etching rate with respect to the etchant after the ion implantation, and the first etching rate is greater than the second etching rate.

16. The method of claim 13, wherein the first opening and the third opening comprise a first width difference, the second opening and the fourth opening comprise a second width difference, and the first width difference is greater than the second width difference.

17. The method of claim 13, wherein the doped region is re-crystallized by the thermal operation.

18. The method of claim 13, wherein the first gate structure is in contact with the first isolation and a portion of the substrate, and the second gate structure is in contact with the second isolation and a portion of the substrate.

19. The method of claim 1, further comprising forming a gate structure over the isolation and the substrate.

20. The method of claim 19, wherein a topmost surface of the isolation is between a topmost surface of the substrate and a bottom most surface of the gate structure.

* * * * *